United States Patent
Quenzer et al.

(10) Patent No.: US 6,168,395 B1
(45) Date of Patent: Jan. 2, 2001

(54) BISTABLE MICROACTUATOR WITH COUPLED MEMBRANES

(75) Inventors: Hans Joachim Quenzer, Itzehoe; Bernd Wagner, Looft, both of (DE)

(73) Assignee: Fraunhofer-Gesellschaft zur Foerderung der Angewandten Forschung E.V., Munich (DE)

( * ) Notice: Under 35 U.S.C. 154(b), the term of this patent shall be extended for 0 days.

(21) Appl. No.: 09/117,919

(22) PCT Filed: Feb. 10, 1997

(86) PCT No.: PCT/EP97/00575

§ 371 Date: Oct. 13, 1998

§ 102(e) Date: Oct. 13, 1998

(87) PCT Pub. No.: WO97/29538

PCT Pub. Date: Aug. 14, 1997

(30) Foreign Application Priority Data

| Feb. 10, 1996 | (DE) | 96 10 1948 |
| Feb. 10, 1996 | (DE) | 196 04 818 |
| Sep. 17, 1996 | (DE) | 196 37 928 |

(51) Int. Cl.[7] ............ F04B 17/00; F16K 31/02
(52) U.S. Cl. .................... 417/413.3; 251/129.01
(58) Field of Search ............ 417/413.3, 413.2; 251/129.01, 129.02; 60/512

(56) References Cited

U.S. PATENT DOCUMENTS

| 4,895,500 | * | 1/1990 | Hok et al. | 417/586 |
| 4,938,742 | * | 7/1990 | Smits | 604/67 |
| 4,979,149 | | 12/1990 | Popovic et al. | 365/244 |
| 5,078,581 | | 1/1992 | Blum et al. | 417/322 |
| 5,085,562 | | 2/1992 | van Lintel | 417/413 |
| 5,096,388 | | 3/1992 | Weinberg | 417/322 |
| 5,142,781 | | 9/1992 | Mettner et al. | 29/890.124 |
| 5,288,214 | * | 2/1994 | Fukuda et al. | 417/395 |
| 5,367,878 | * | 11/1994 | Muntz et al. | 60/512 |
| 5,452,878 | | 9/1995 | Gravesen et al. | 251/129.02 |
| 5,674,742 | * | 10/1997 | Northrup et al. | 435/186.5 |
| 5,725,363 | * | 3/1998 | Bustgens et al. | 417/413.1 |
| 5,759,014 | * | 6/1998 | Van Lintel | 417/413.3 |

FOREIGN PATENT DOCUMENTS

| 4422971 | 1/1996 | (DE) . |
| 1266376 | 1/1990 | (JP) . |

OTHER PUBLICATIONS

Timoshenko, Gene *Buckling of Thin Plates*, Theory of Elastic Stability, pp. 388–393.

P. Rangsten, et al., *Electrostatically Excited Diaphragm Driven as a Loudspeaker*, Transducers '95—Eurosensors IX, The 8th International Conference on Solid–State Sensors and Actuators, and Eurosensors IX, Stockholm, Sweden, pp. 430–433, Jun. 25–29, 1995.

Shikida, et al., *Fabrication of an Electrostatic Microactuator with an S–Shaped Film*, Transducers '95—Eurosensors IX, The 8th International Conference on Solid–State Sensors and Actuators, and Eurosensors IX, Stockholm, Sweden, pp. 426–429, Jun. 25–29, 1995.

Bertz, et al., *The Formation of Very Flat Silicon Sidewalls by Dry Etching*, pp. 23–27, J. Micromech. Microeng. 4(1994).

Huff, et al., *A Threshold Pressure Switch Utilizing Plastic Deformation of Silicon*, Proc. Transducers 91, San Francisco, pp. 177–180, 1991.

(List continued on next page.)

*Primary Examiner*—Teresa Walberg
*Assistant Examiner*—Daniel Robinson
(74) *Attorney, Agent, or Firm*—Duane, Morris & Heckscher

(57) ABSTRACT

A bistable electrostatic actuator with pneumatic or liquid coupling. The actuator has enclosed metallic electrodes. It can be used for a microvalve or micropump. The actuator has buckled membrane sections in pairs and curved substrate electrodes, locally associated with said membrane sections.

15 Claims, 13 Drawing Sheets

OTHER PUBLICATIONS

Matoba et al., *A Bistable Snapping Microactuator*, Proc. Mems. 94,0150, pp. 45–50, 1994.

Halg, *On a Micro–Electro–Mechanical Nonvolatile Memory Cell*, IEEE Transactions on Electron Devices, vol. 37, No. 10, pp. 2230–2236, Oct., 1990.

Popescu, et al., *Buckled Membranes for Microstructures*, Proc. Mems. 94,0150, pp. 188–192, 1994.

Soderkvist and Lindberg, *Characteristics of Quasi Buckling*, Sensors and Materials, vol. 6, No. 5, pp. 293–309, 1994.

Esashi et al., Normally Closed Microvalve and Micropump Fabricated on a Silicon Wafer, Sensors and Actuators, 20 (1989) 163–169.

Barth, Silicon Microvalves for Gas Flow Control, Proc. Trademarks 95, Eurosensors XI, Stockholm, Jun. 25–29, 1995, pp. 276–279.

Bertz, et al., Silicon Grooves with Sidewall Angles Down to 1° Madeby Dry Etching, Micro System Technologies '94, 4th International Conference on Micro Electro, Opto, Mechanical Systems and Components, Berlin, Oct. 19–21, 1994, pp. 331–339.

Gabriel, et al., Surface–Normal Electrostatic/Pneumatic Actuator, Micro–Electro Mechanical systems '92. Travemunde (Germany), Feb. 4–7, 1992, pp. 128–132.

Branabjerg and Gravesen, A New Electrostatic Acutator Providing Improved Stroke and Length and Force, Micro Electro Mechanical Systems +92, Travemunde (Germany), Feb. 4–7, 1992, pp. 6–11.

Drake and Jerman, A Precision flow Restrictor for Medical Infusion Therapy, Proc. Transducers 95 & Eurosensors IX, Stockholm, Sweden, Jun. 25–29, 1995, pp. 373–376.

Goll, et al., Microvalves with Bistable Buckled Polymer Diaphragms, Micromechanics Europe 95 (MME 95), Copenhagen, Sep. 2–5, 195, pp. 108–111.

Wagner, et al., Microfabrication of Complex Surface Topographies Using Grey–Tone Lithography, Sensors and Actuators, A 46–47 (1995), pp. 89–94.

* cited by examiner

1. LITHOGRAPHY 1
   (GREY TONE LITHOGRAPHY)
2. DRY-ETCHING

3. LITHOGRAPHY 2
4. IMPLANTATION 1: ELECTRODES
5. ANNEALING

6. LITHOGRAPHY 3
7. IMPLANTATION 2: SUBSTRATE
8. ANNEALING
9. OXIDATION

10. BONDING OF SOI WAFER

11. ETCH-BACK
12. LITHOGRAPHY 4
13. MEMBRANE ETCHING

20b — MEMBRANE (BUCKLING NOT SHOWN)

14. LITHOGRAPHY 5: VIAS
15. DRY-ETCHING

16. SPUTTERING PLATING BASE
17. LITHOGRAPHY 6: METALLISATION
18. ELECTROPLATING
19. IONMILLING PLATING BASE

16. SPUTTERING PLATING BASE
17. LITHOGRAPHY 6: METALLISATION
18. ELECTROPLATING
19. IONMILLING PLATING BASE

METAL

1. DEPOSITION OF PYREX GLASS
2. LITHOGRAPHY 1: DEFINITION OF FRONT SIDE
3. ETCHING OF GLASS LAYER
4. ETCHING OF SILICON

5. PLATING BASE SPUTTERING
6. LITHOGRAPHY 2: VALVE SEAT
7. ELECTROPLATING OF GOLD
8. REMOVE OF THE PLATING BASE

9. LITHOGRAPHY 3: REAR SIDE
10. DRY TECHING REAR SIDE
11. ANISOTROPIC ETCHING

BISTABLE MICROACTUATOR WITH COUPLED MEMBRANES

BACKGROUND OF THE INVENTION

1. Field of the Invention

The invention concerns a bistable electrostatic actuator with pneumatic or liquid coupling.

2. Prior Art

From power and safety considerations mechanically bistable acuators are of considerable importance. However, only a few bistable microactuators fabricated in silicon technology have been reported[1,2,3]. Due to the low power consumption electrostatic drives are often preferred to electromagnetic and thermomechanic actuators. A drawback of electrostatics is its low range. High voltages are needed to achieve large deflections. Different concepts have been reported to produce non-planar driving electrodes[4,5,6,7]. These technologies are however rather specific and not for general-purpose use. Further prior art is sensitive, since electrodes are free to the environment, e.g. particles. This can be improved, when enclosed electrodes, separated from the gaseous or liquid medium are formed[4].

1 B. Hälg, On a micro-electro-mechanical nonvolatile memory cell, IEEE Trans. Electron. Dev. 37 (1990) 2230–2236
2 H. Matoba, T. Ishikawa, C.-J. Kim, R. S. Muller, A bistable snapping microactuator, Proc. MEMS 94, Oiso, 45–50
3 M. A. Huff, A. D. Nikolich, M. A. Schmidt, A threshold pressure switch utilizing plastic deformation of silicon, Proc. Transducers 91, San Francisco, 177–180
4 J. Branebjerg, P. Gravesen, A new electrostatic actuator providing improved stroke length and force, Proc. MEMS 92, 6–11
5 A. Bertz, T. Werner, The formation of very flat silicon sidewalls by dry etching, J. Micromech. Microeng. 4 (1994) 23–27
6 M. Shikida, K. Sato, T. Harada, Fabrication of an electrostatic microactuator with an S-shaped film, Proc. Transducers 95 & Eurosensors IX, Stockholm, 426–429
7 P. Rangsten, L. Smith, L. Rosengren, B. Hök, Electro-statically excited diaphragm driven as loudspeaker, Proc. Transducers 95 & Eurosensors IX, Stockholm, 430–433
4 see footnote 4.

SUMMARY OF THE INVENTION

One of the underlying problems addressed by the invention is the reduction of deflection voltage to make the actuator suitable for a general purpose use.

According to the invention two buckled membranes span over connected cavities with enclosed driving electrodes. The membranes operate in counteraction, if one membrane section is pulled down electrostatically, the other membrane section is pushed up and vice versa.

The coupling may be air (pneumatic) or liquid,

The actuator module is designed to achieve a deflection of ±10 μm and can be integrated in a microvalve for controlling the flow of fluids. With completed actuator modules the electrostatic driving principle is used in examples for a valve application, e.g. an on/off valve or a multi-way-valve, a switch application, e.g. an on/off-switch or a changeover switch, a micropump application. Grey-tone lithography may be applied to fabricate the curved driving electrodes on the curved cavity bottom Compared to flat electrodes the driving voltage can thus be reduced up to a factor of five. The curved cavity bottom ("dimple") also improves the pneumatic or liquid coupling since the enclosed air or liquid volume is minimized.

The design and technology of the bistable electrostatic actuator with enclosed electrodes for a microvalve application uses curved shape of the electrodes by employing grey-tone lithography, a method to produce arbitrary relief-type surfaces. To produce a membrane deflection away from the substrate a pneumatic coupling of two cavities is incorporated slightly related to the suggestion[8] of MEMS 92, Travemünde.

8 K. J. Gabriel, O. Tabata, K. Shimaoka, S. Sugiyama, H. Fujita, Surface-normal electrostatic/pneumatic actuator, Proc. MEMS 92, Travemünde, 128–132

The two buckling sections of the membrane are oppositely stable (claim 15) and close to each other in the same wafer.

BRIEF DESCRIPTION OF THE DRAWINGS

Examples are described with reference to the enclosed Figures.

FIG. 1c shows a comparative example having a flat shaped electrode 21f below the membrane section 20a.

FIG. 6a to

FIG. 7a to

DETAILED DESCRIPTION OF THE PREFERRED EMBODIMENTS

Figure 1:
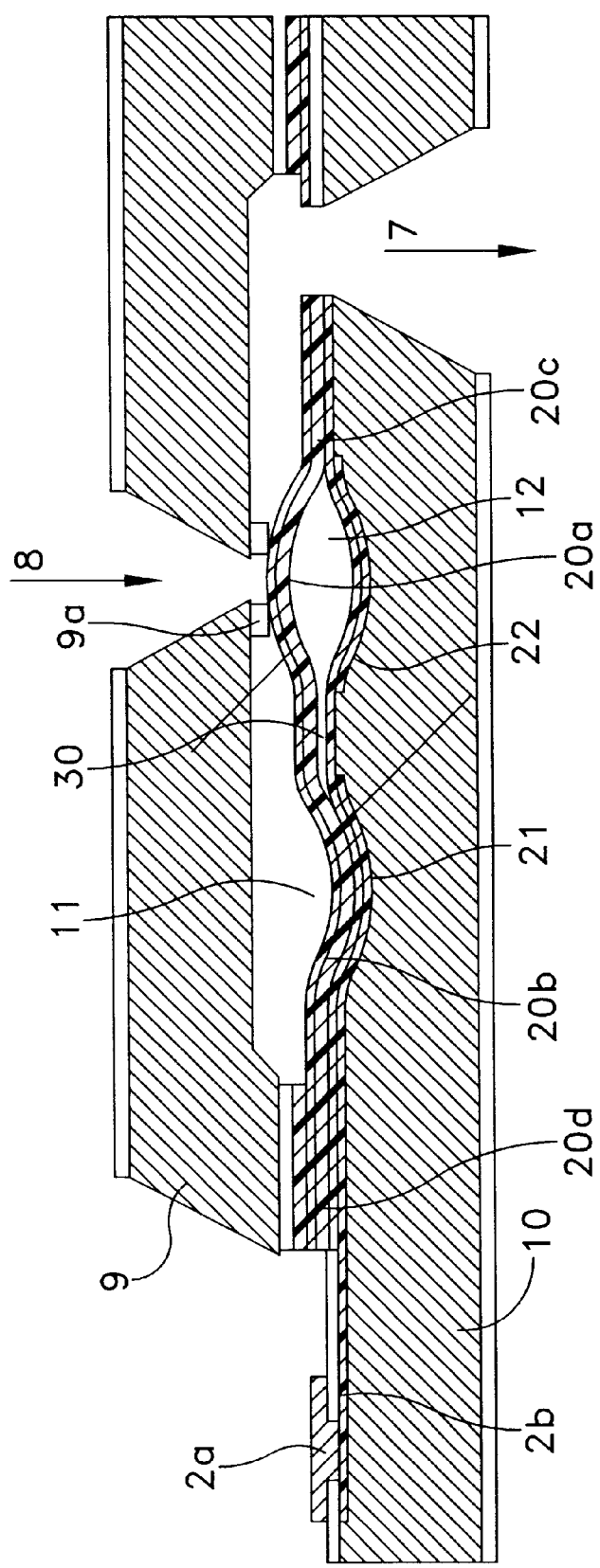
FIG. 1 is a schematic cross-section of the a bistable microvalve with two buckling membrane sections 20a, 20b of a membrane 20.

FIG. 1 shows a schematic cross-section of a first example of a valve with buckling membranes.

Figure 2A:
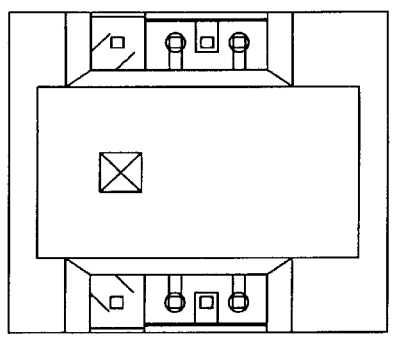
FIG. 2a is the side view of the anodic bonded three part embodiment as seen in FIG. 2, having an actuator chip 100 with bonded membrane 20 and on top the valve seat chip 200.
Figure 2A:
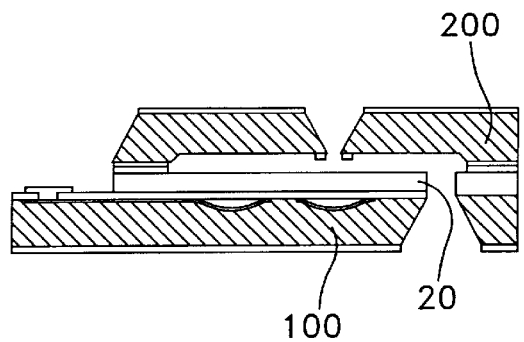
Figure 2:
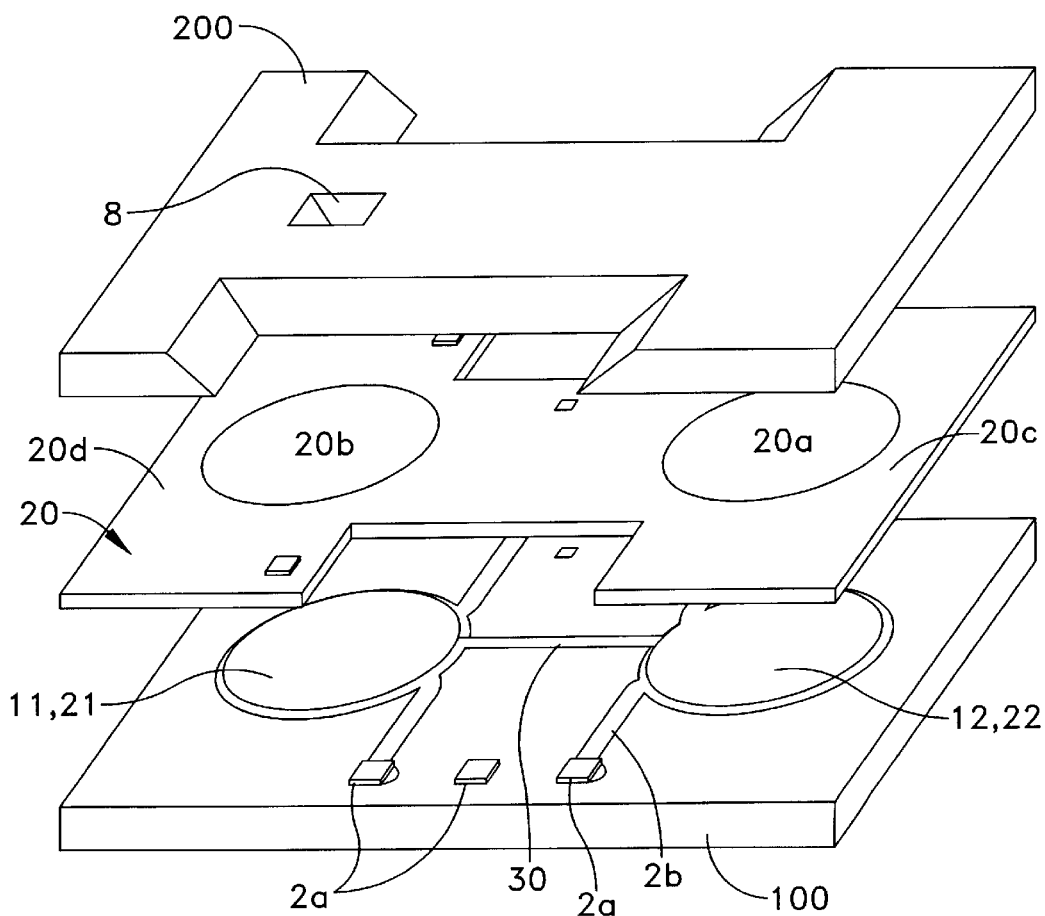
FIG. 2 shows an exploded view of the bistable microvalve of FIG. 1. Visible is a coupling channel 30 between the cavities 11, 12. The outlet 8 is just behind the channel 30.

FIG. 2 shows an exploded view of the bistable microvalve.

FIG. 2a is its side view. The manufacturing of FIGS. 6 and 7 leads to the FIG. 2a embodiment.

The lower active chip 100 of the valve contains two silicon membranes 20b, 20b, which are buckling due to intrinsic compressive stress. The cavities 11, 12 below the closely spaced membranes 20a, 20b are air-filled and connected by a channel 30. Thus, the membranes are pneumatically coupled in order to operate in counteraction. Each membrane section 20a, 20b can be switched down by electrostatic forces using an underlying driving electrode 21 and 22 as can also be seen from FIG. 8, which displays the same principle of membrane buckling in a multi-way application (3/2 way valve). By switching one membrane down the air is pressed through the channel 30 and pushes the second membrane up. The use of two coupled membranes has the advantage that the valve can be operated electrostatically in both directions without applying a voltage across the fluid. The actuator is separated from the medium. Another advantage of the coupled membranes is its insensitivity against external pressure changes.

The electrodes 21, 22 are curved to decrease the gap towards the outside clamping areas 20c, 20d. Thus the electrostatic forces are increased and/or the switching voltage can be reduced. The electrodes 21, 22 are implanted in the dimples to allow a Si—Si bonding process for the membrane formation without metallic feedthroughs. The pneumatic coupling is improved by the curved cavity bottom 11, 12. The enclosed air volume is as small as possible.

The microvalve is completed by etching an outlet opening 7 in the lower chip 100 and bonding of an upper chip 200 carrying the inlet 8 and valve seat 9a. This is shown in FIG. 2a. Valve seat 9a may be metallic, to provide switch applications according to FIG. 9.

If similar reference numerals are used along the description, they are designated to show the same elements.

In FIG. 1 the buckled membranes 20a, 20b are provided with metallic layers, cooperating with the electrodes 21, 22 on the bottom of the cavities 11, 12. The electrodes 21, 22 and the metallic layers can be supplied via contact paths. Contact pad 2a connects via contact path 2b to electrode 21 as shown and contact pad 2a is applied near or in further distance of the valve, shown in FIG. 8 or 1. The substrate 10 is identified as actuator chip 100 in FIG. 2a and manufactured according to FIGS. 6a to 6h. The valve seat chip 9 is identified as upper chip 200 in FIG. 2a and manufactured according to FIG. 7a to 7c. An inlet 7 and outlet 8 is provided close to one of the membranes 20a each passage 7, 8 is provided in one of the valve seat chip 9 (corresponding to the upper chip 200) and the substrate 10 (corresponding to the actuator chip 100). The flow direction of inlet and outlet may be reversed. A valve seat 9a is provided opposite the buckling area 20a above cavity 12, in which the electrode 22 is provided. In FIG. 1 the membrane section 20a directly cooperates with the valve seat, although according to FIG. 9 a contact pad may be provided between them, however for a different use.

The description focusses on the bistable actuator in valve application, however pump and switch application (1/2- or 3/2-valve) are possible, as outlined in FIGS. 8 to 11.

The theory of buckling beams and square membranes has been described[1,9,10] by Haelg, Söderkvist, Popescu. In the case of circular membranes the critical compressive stress is given by:

$$\sigma_{cr} = \frac{14,68}{R^2} \cdot \frac{E \cdot t^2}{12(1-n^2)}$$

where R is the radius, t the thickness and E and n are the elasticity constants of the membrane, see Pepescu[11]. For stress values above $\sigma_{cr}$ the membrane buckles out. In good approximation the membrane deflection has a cosinus-square shape $$d(r) = d_0 \cdot \cos^2 \frac{\pi \cdot r}{2 \cdot R}$$

The center deflection $d_0$ grows proportional to sqrt ($\sigma/\sigma_{cr}$–1).

9 J. Söderkvist, U. Lindberg, Characteristics of quasi buckling, Sensors and Materials, 6 (1994) 293–309
10 D. S. Popescu, T. S. Lammerink, M. Elwenspoek, Buckled membranes for microstructures, Proc. MEMS 94, Oiso, 188–192
11 S. P. Timoshenko, J. M. Gere, Theory of elastic stability, McGraw-Hill 1961, pp. 389

The target specification of the valve of FIG. 1 is to have a center membrane deflection of ±10 μm. The mechanical force to switch the buckled membrane should be about 1 mN. This leads to a design with a silicon membrane thickness of 7 μm. Membranes with diameters of 2 mm and 3 mm were investigated. The membranes are fabricated as a double layer of stress-free single-crystal silicon covered with thin silicon oxide on one side. For thermally grown $SiO_2$ an intrinsic compressive stress of about $3.10^8$ N/m2 has been measured. The manufacturing of such membrane 20 is step by step shown in FIGS. 6d, 6e steps (10) to (13).

Figure 3:
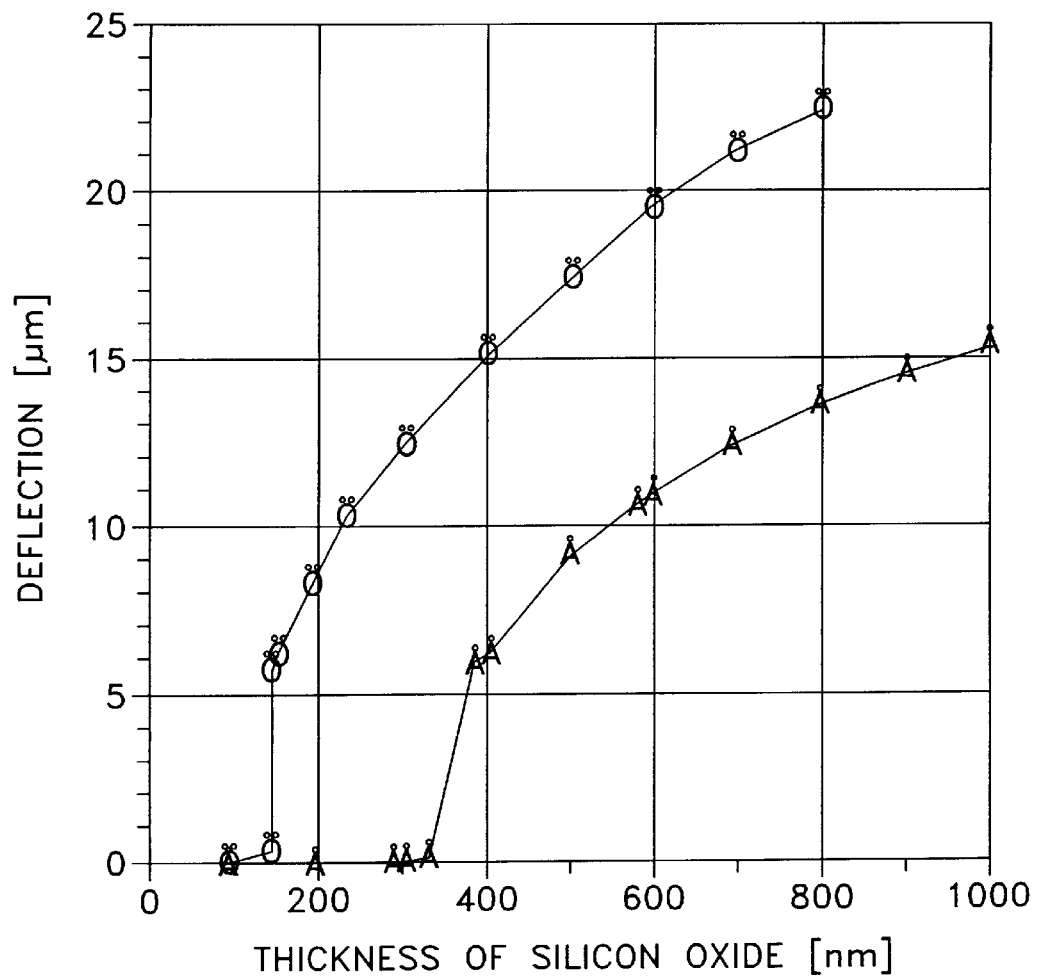
FIG. 3 is a finite-element calculation of the buckling of circular membranes, 2 mm (A-points) and 3 mm (Ö-points) in diameter. The membranes have a silicon thickness of 7 μm and are covered single sided with silicon oxide.

The electromechanical behaviour of the bistable membrane 20 has been calculated with finite-element-analysis (FEA) using ANSYS software. In FIG. 3, 4 the FEA result of 7 μm thick silicon membranes is given. Above threshold the deflection increases with the square-root of the $SiO_2$ thickness (single sided with silicon oxide). The 2 mm membrane uses 585 nm silicon oxide, the 3 mm membrane 240 nm silicon oxide to buckle 10 μm. In the further simulation the thickness of the $SiO_2$ layer was fixed in order to achieve a deflection of 10 μm. The major results of the calculation are given in Table 1 below.

Table 1 shows the results of the FEA for 7 μm thick silicon membranes covered on one side with silicon oxide. The $SiO_2$ thickness is determined in order to obtain buckling with a 10 μm center deflection.

| | | | |
|---|---|---|---|
| membrane diameter | [mm] | 2.0 | 3.0 |
| SiO$_2$ thickness | [nm] | 585 | 240 |
| mech. snapping force | [mN] | 1.35 | 0.6 |
| U$_{\text{flat electrode}}$ | [V] | 245 | 105 |
| U$_{\text{curved electrode}}$ g$_{min}$ = 1.0μm | [V] | 88 | 38 |
| U$_{\text{curved electrode}}$ g$_{min}$ = 0.3 μm | [V] | 47 | 22 |

Figure 4:
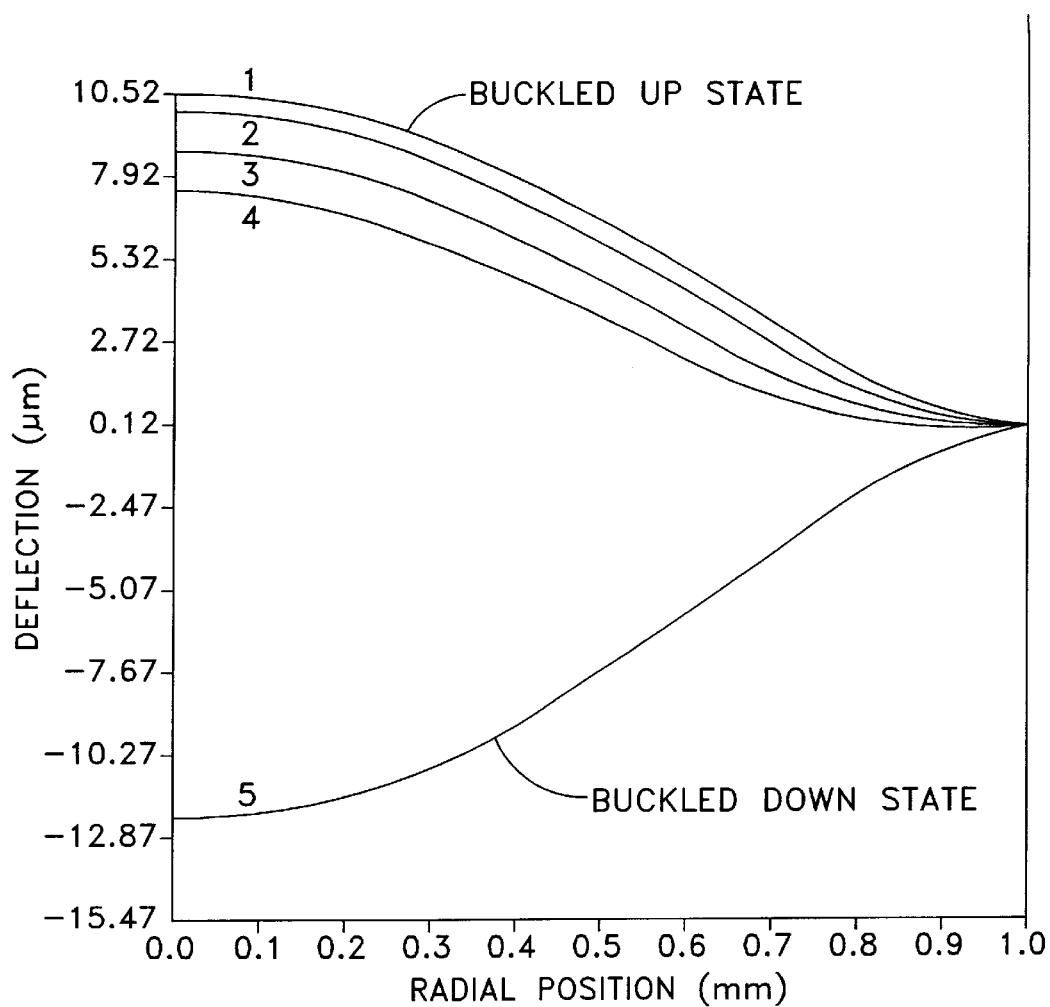
FIG. 4 is an iterative electrostatic finite-element calculation of the snapping process of bistable membrane sections 20a, 20b in the membrane 20. The steps are marked (1) . . . (5).

The mechanical forces to snap the membranes are 1.35 mN and 0.60 mN, respectively. As mentioned above, the electrostatic switching voltages strongly depend on the distance and shape of the lower driving electrodes. Two examples are shown in FIG. 1b and 1c. In FIG. 1c a flat electrode 21f on the bottom of a 10 μm deep cavity is assumed. In FIG. 1b curved electrodes 21, 22 with the cos$^2$-shape, substantially corresponding to each down-buckled membrane 20a, 20b are calculated. The maximum depth is 10 μm again. Of interest is the minimum air gap at the clamping. Two values, 1 μm and 0.3 μm have been chosen for this parameter. The calculation of driving voltages was performed in an iterative electrostatic-mechanical manner. FIG. 4 shows the membrane deflection in five steps of the calculation as being moved from upwards stable condition (1) to downwards stable position (5). When snapping over, the membrane forms an intermediate state which is sine-shape. This instable shape could not be calculated. The switching voltages are also listed in Table 1. Compared to the flat electrodes 21f the cosinus-square electrode 21, 22 with 1 μm minimum gap g$_{min}$ reduce the voltage to 36%. With a gap of g$_{min}$ 0.3 μm a voltage of about 20% of the flat-electrode value is sufficient.

The process sequence of FIGS. 6a to 6h, FIGS. 7a to 7c and FIG. 2a starts on double-sided polished 525 μm thick n-type wafers 10 (5–15Ωcm) with the etching of the coupled cavities 11, 12. In a first complete fabrication run the process to realize cavities 11, 12 with curved bottom electrodes (see FIG. 1b) was not yet included, it was performed later (after priority, before actual filing date). Cavities with a constant depth of 4.5 μm were etched using an isotropic etching solution (HNO$_3$:HF:CH$_3$COOH=8:1:3) and a silicon oxide mask.

After removal of the SiO$_2$ mask the wafers are oxidized again (50 nm). The next step is an implantation defining the area of the two isolated substrate electrodes 21, 22 (boron, 70 keV, 1.10$^{16}$ cm$^{-2}$) seen in FIG. 6b, step (4). A photolitography with a 6 μm thick resist is used to achieve a good step coverage. This prevents undesired doping of the coupling channel between the two cavities. The boron ions are activated by an 1500° C. drive-in process for 7 hours in an N$_2$/O$_2$ gas mixture to achieve a homogeneous dopant distribution in the vertical side walls of the cavities. The following second implantation (phosphorus, 70 keV, 1.10$^{16}$ cm$^{-2}$) defines the n$^+$-contact area to the n-type substrate. The implantation is activated by a 1000° C. annealing in nitrogen for 1 hour, see steps (7) and (8) in FIG. 6c.

Figure 6A:
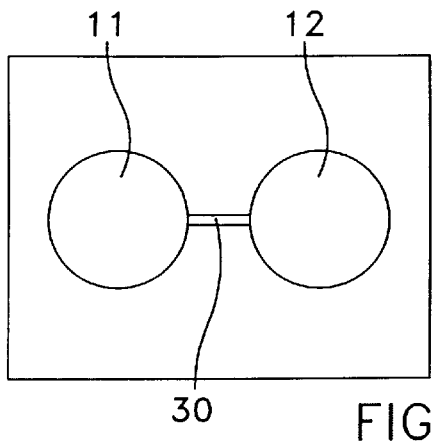
Figure 6A:
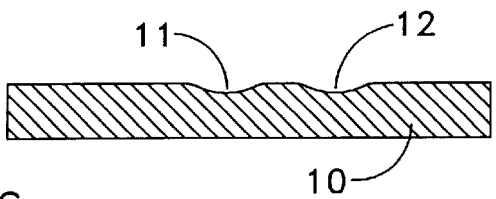
Figure 6B:
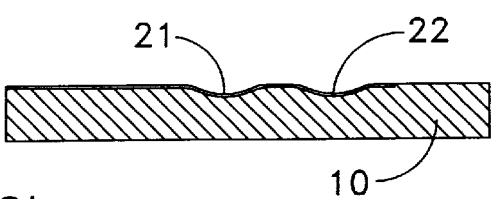
Figure 6C:
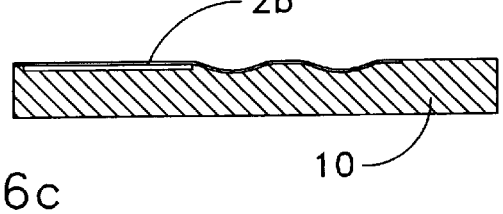
Figure 6D:
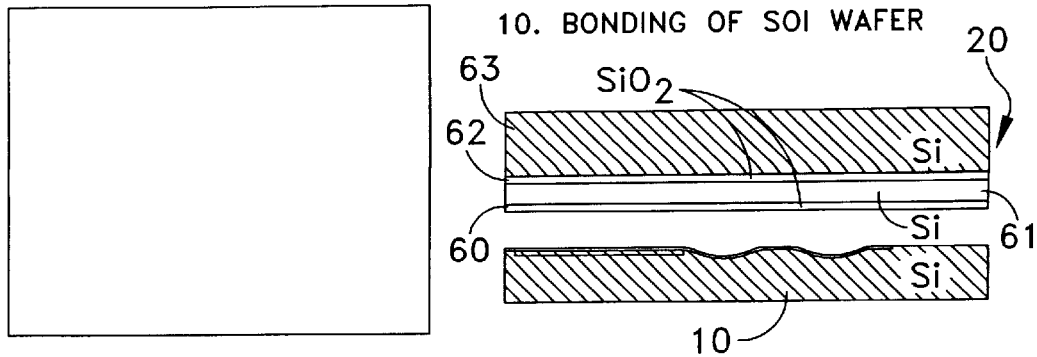
Figure 6E:
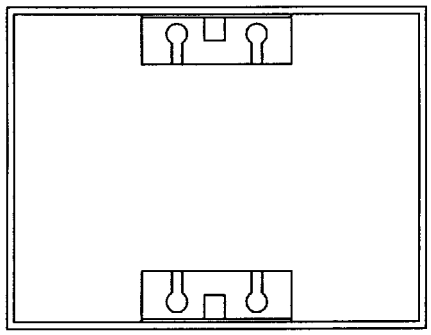
Figure 6E:
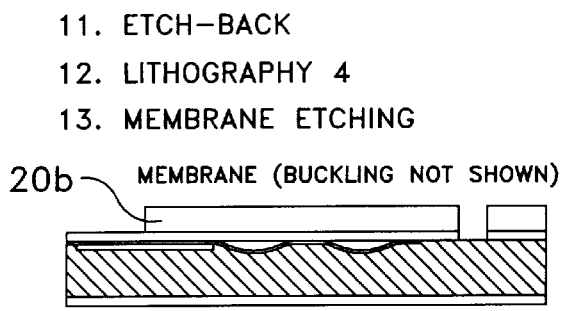
Figure 6F:
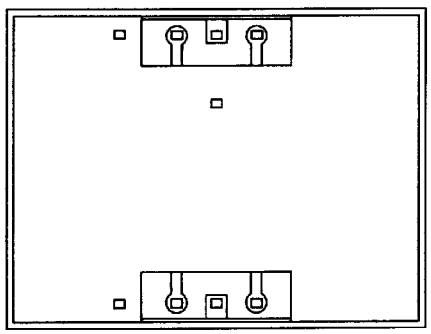
Figure 6F:
Figure 6G:
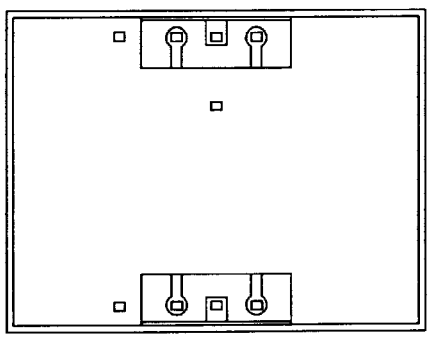
Figure 6G:
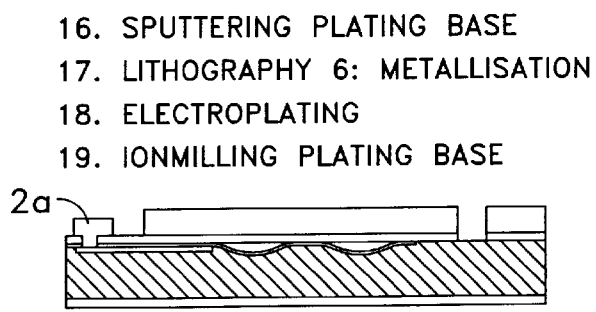
Figure 6H:
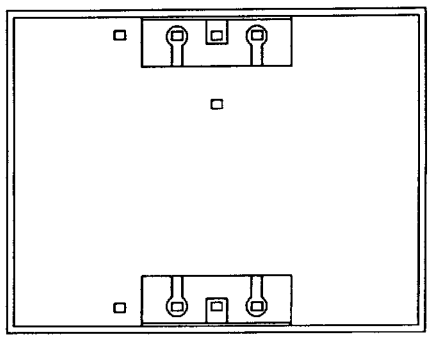
FIG. 6h are steps (1) to (22) in an exemplary manufacturing process to provide the actuator chip 100 with bonded membrane 20. Each step of manufacturing is represented in the figures; each FIG. 6a to 6h simultaniously shows a section in side view (righthand) and top view (lefthand).
Figure 6H:
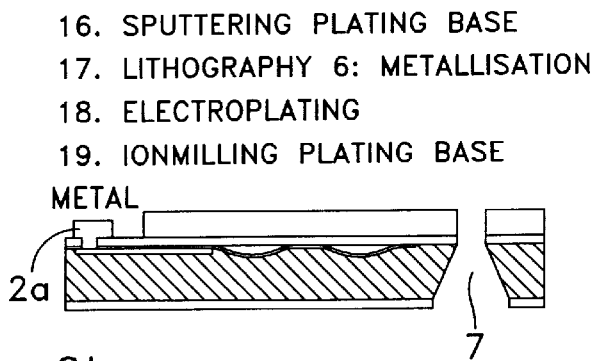
Figure 7A:
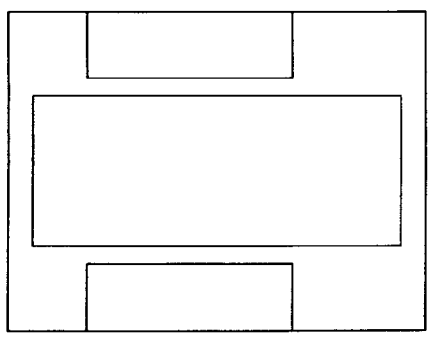
Figure 7A:
Figure 7B:
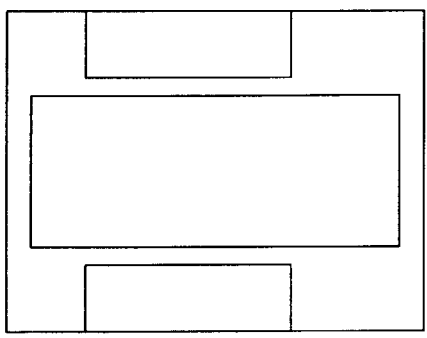
Figure 7B:
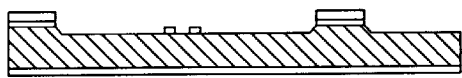
Figure 7C:
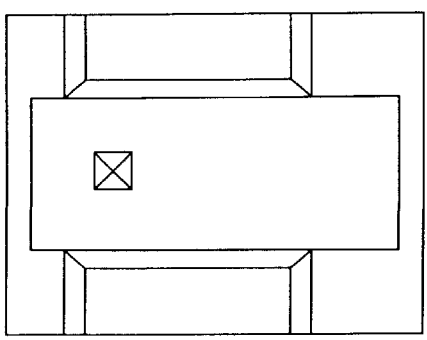
FIG. 7c are an exemplary process with manufacturing steps (1) to (11) for providing the valve seat 200, to be anodic bonded to the actuator chip turned upside down and shown in FIG. 2a as side sectional view. The buckling of the membrane 20 is for clarity reasons not shown in FIGS. 6, 7 and 2a, but in the schematic views of FIG. 1 and 1b, 1c.
Figure 7C:
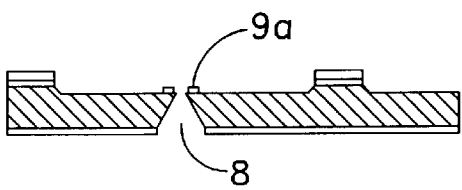

The membranes of the actuator module are fabricated by silicon bonding of an SOI-wafer (silicon on insulator), as seen in steps (10) to (13) in FIGS. 6d, 6e. Commercial SOI wafers with a 7 μm thick silicon layer 63 on a 1 μm intermediate silicon oxide 62 were used. Before bonding, the SOI wafer is oxidized to grow a silicon oxide 60 of 380 nm. This layer 60 is responsible for the membrane buckling. The thickness is a medium value for the 2 mm and 3 mm membranes. To achieve a high bonding strength the bonded wafer pairs are annealed at 1000° C. in nitrogen and then oxidized at 1000° C. to a thickness of about 500 nm. In the next step (11) the substrate 63 of the SOI-wafer is etched back completely in 25% aqueous TMAH at 90° C. The 1 μm thick intermediate Sio$_2$ 62 acts as an etch stop layer.

This stopping oxide 62 is thinned down to about 200 nm by dry etching, see step (13). The following lithography defines the access areas to the implanted substrate electrodes beneath the membrane areas 20a, 20b. After opening of the oxide by RIE the silicon membrane is locally removed in 25% aqueous TMAH at 90° C. After defining the contact holes to the implanted electrodes, to the substrate and to the membrane in step (15) the wafer is metallized with aluminum in step (16). The metal is structured by wet etching. Finally, the SiO$_2$ layer on top of the membrane is completely removed by dry etching.

In a second exemplary manufacturing process the same steps as given above are employed, however, deviating at steps as given in FIG. 6a to 6h with the full step sequence (1) to (22).

The process to obtain the cosine-shaped curvature of the cavity bottom has been developed separately in parallel. Basis is grey-tone lithography which uses a raster-screened photomask to produce arbitrarily curved resist profiles[12]. With a 5:1 projection lithography and mask pixels of sub-resolution size a smooth curved resist shape is obtained. In the lithography a 13 μm thick photoresist is used. Subsequently the resist contour is transferred to the silicon substrate by dry etching. The RIE process is optimized in order to obtain nearly equal etching rates for silicon and the resist.

[12] B. Wagner, H. J. Quenzer, W. Henke, W. Hoppe, W. Pilz, Microfabrication of complex surface topographies using grey-tone lithography, Sensors and Actuators A 46–47 (1995) 89–94

The pneumatic coupling of two membrane sections 20a, 20b has been confirmed first with a passive test module. The chip containes two buckled Si/Sio$_2$ membranes with a diameter of 2 mm. They cover two air-filled cavities connected by channel 30.

Figure 1A:
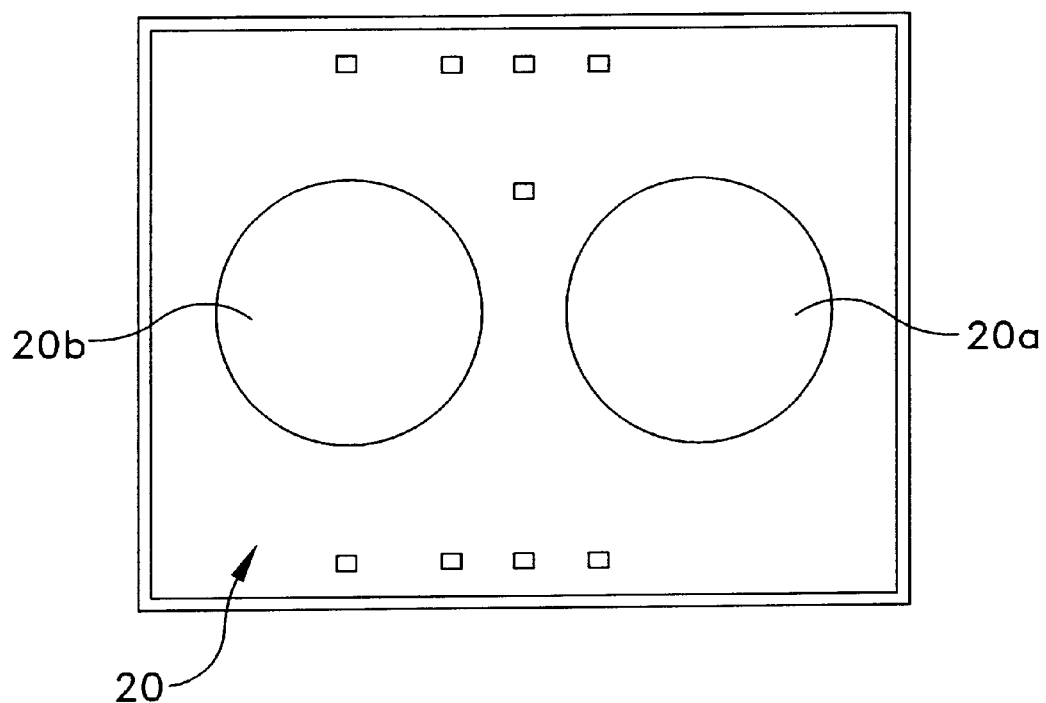
FIG. 1a is a total view of the membrane 20 with the buckling sections 20a, 20b in a top view and considerably enlarged.
Figure 1B:
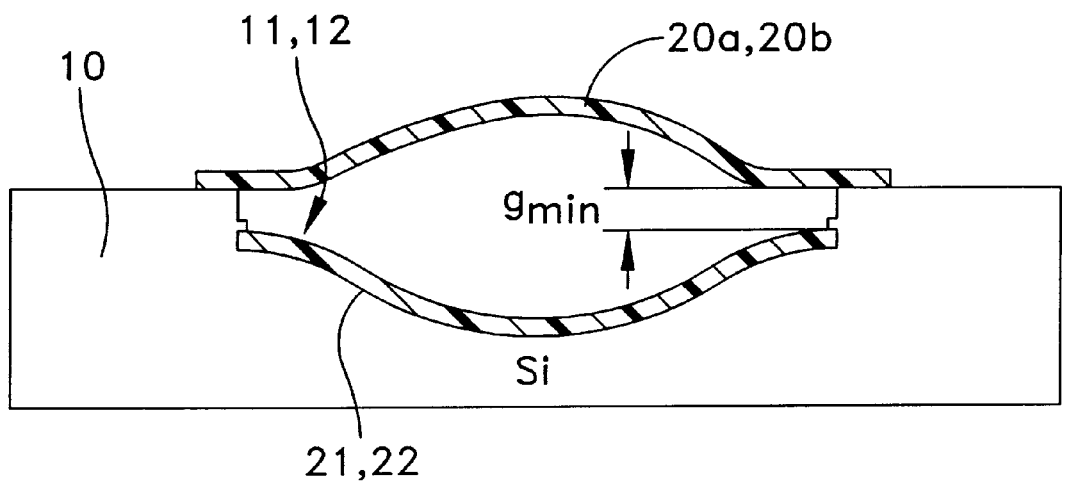
FIG. 1b is a side view in section of only one smoothly curved flat dimple with an overlying buckling membrane, representing both membrane sections 20a, 20b and both dimples 11, 12 of FIG. 1.
Figure 1C:
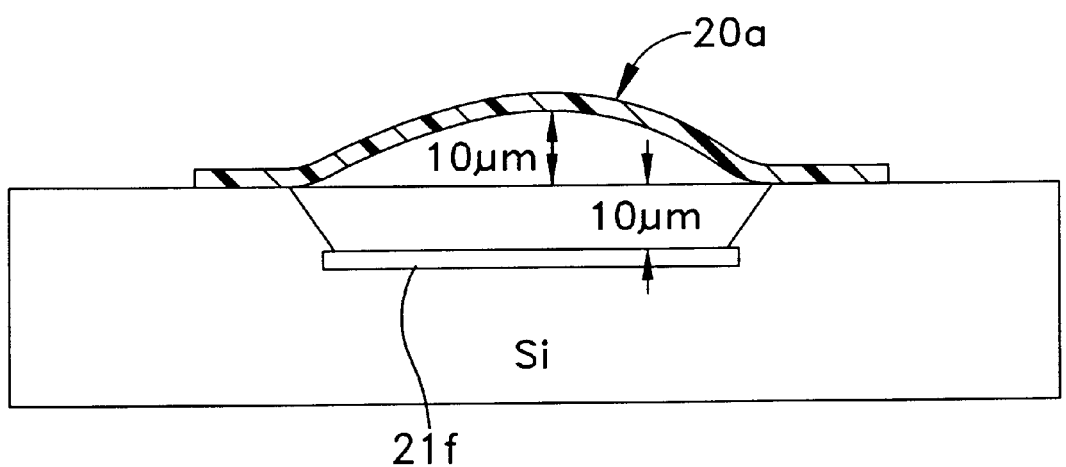

In FIG. 1a a completed bistable actuator module combining a 2 mm membrane with a 3 mm membrane is shown. The smaller membrane buckles up with a maximum deflection of 6.0 μm. This value is in accordance with the SiO$_2$ thickness of 380 nm. The larger membrane buckles down and is pressed on the bottom of the 4.5 μm deep cavity.

A breakdown voltage for the pn-isolation of 220V has been measured. With a voltage of 50V the 2 mm membrane could be pulled down. This yields a buckling up of the 3 mm membrane which was not quite complete. The membrane got into an asymmetric shape. The reason is probably that the pressure inside the cavity is lower than athmosperic pressure. This comes from the fact that the bonding has been performed in air. In the subsequent high temperature treatment the oxygen is lost which reduces the pressure inside. The 3 mm membrane is switched down with 15V and pushes the 2 mm membrane up completely.

Figure 5:
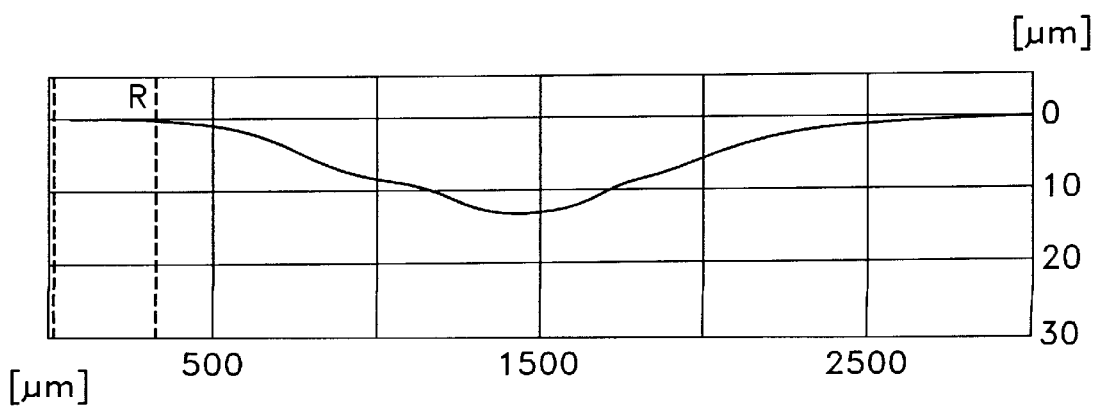
FIG. 5 is a profile plot of a grey-tone lithograhic structured hollow (dimple) in silicon. This substantially cosinus-square contour is the optimum shape for the dimple bottom with associated driving electrodes.
Figure 8:
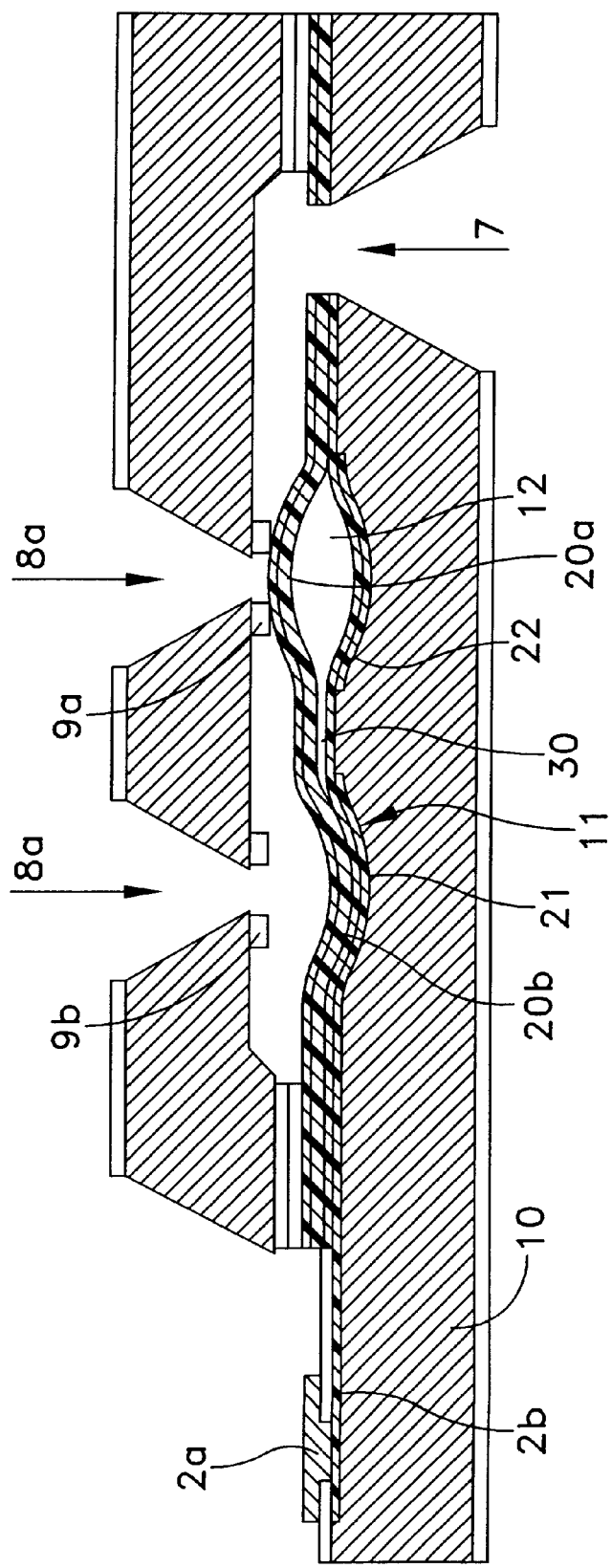
FIG. 8 is a three/two way valve with two outlets 8a and 8b and on inlet 7.

In FIG. 5 a profile measurement plot of a dimple in the cosine-square-shape as the driving electrode 21, 22 is shown. FIG. 8 provides two passage ways 8a, 8b for alternative flow depending on the membrane position. In the displayed state passage way 8a is closed by buckled up membrane 20a and passage way 8b is clear for flow communication to passage way 7 in the actuator chip 10, or for vice versa flow from passage way 7 to passage way 8b. Applying voltage to electrode 22 will attract membrane section 20a couple the fluid flow of dimple 12 via the passage way 30 between the membrane section 20a and 20b and push membrane section 20b upwards to close valve seat 9b and thereby close passage way 8b and open passage way 8a for flow communication to passage way 7. The opposite switch proceeding may be easily recognised.

Figure 9:
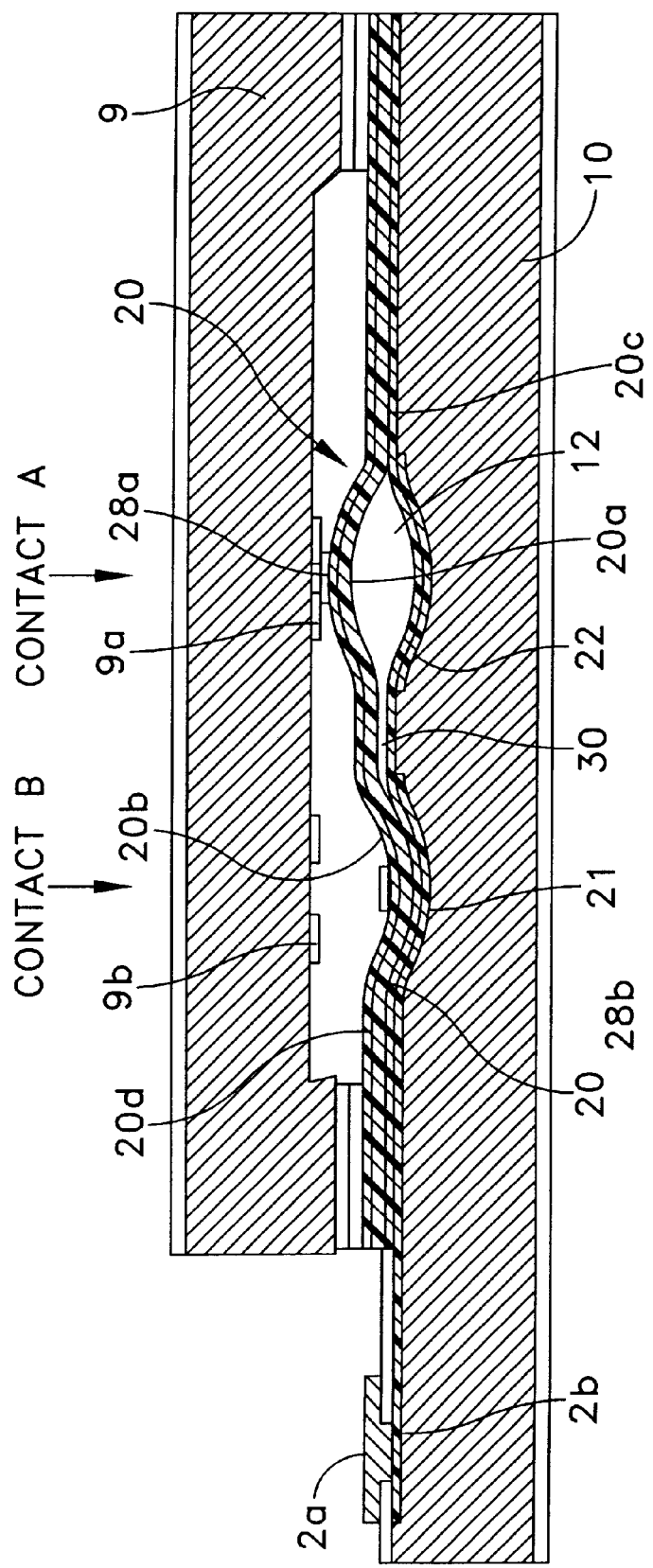
FIG. 9 is an electronic switch providing a contact above membrane section 20a. The contact is shown in closed condition wherein the metallic valve seat 9a cooperates with a metallic contact section 28a, applied to the top of the membrane section 20a. A second cooperating contact pair 9b, 28b is provided associated to membrane section 20b. Thus two contacts A, B are provided, which can be operated as changeover switch, depending on the metallic structures connecting the contact sections 28a, 28b.

FIG. 9 was described earlier and has no passage or inlet or outlet in the valve seat chip 9, but electric contact pads 9a, 9b for electric contact communication with contact pads 28a, 28b on the membrane section 20a, 20b. Applying voltage to electrode 22 will open electric contact 28a, 9a and close electric contact 28b, 9b. The reverse switch operation is easily recognised. It is self evident, to provide electric contact paths similar to contact path 2b also on valve seat chip 9 in cooperation with electric valve seats 9a, 9b.

Figure 10:
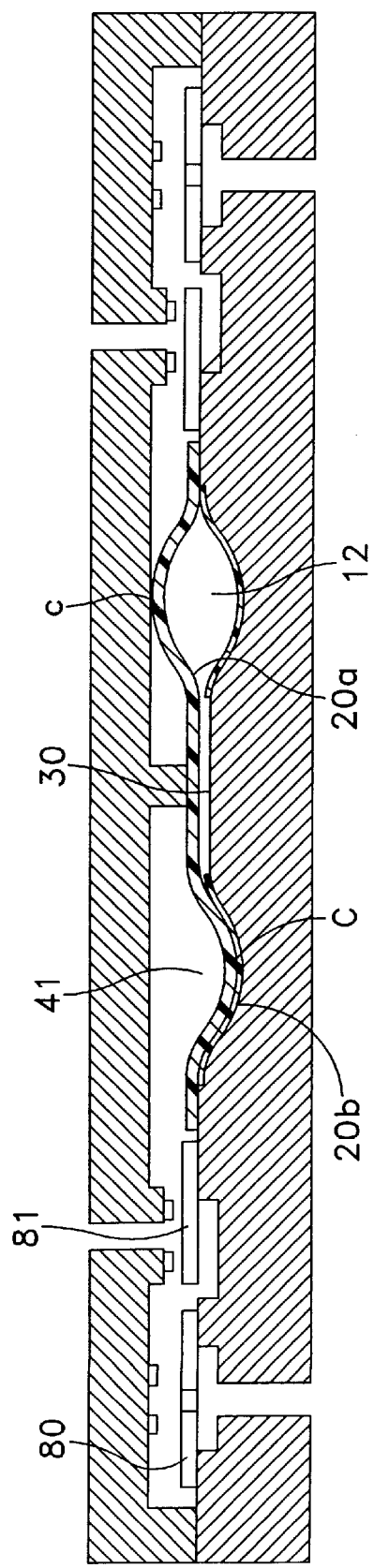
FIG. 10.
Figure 11:
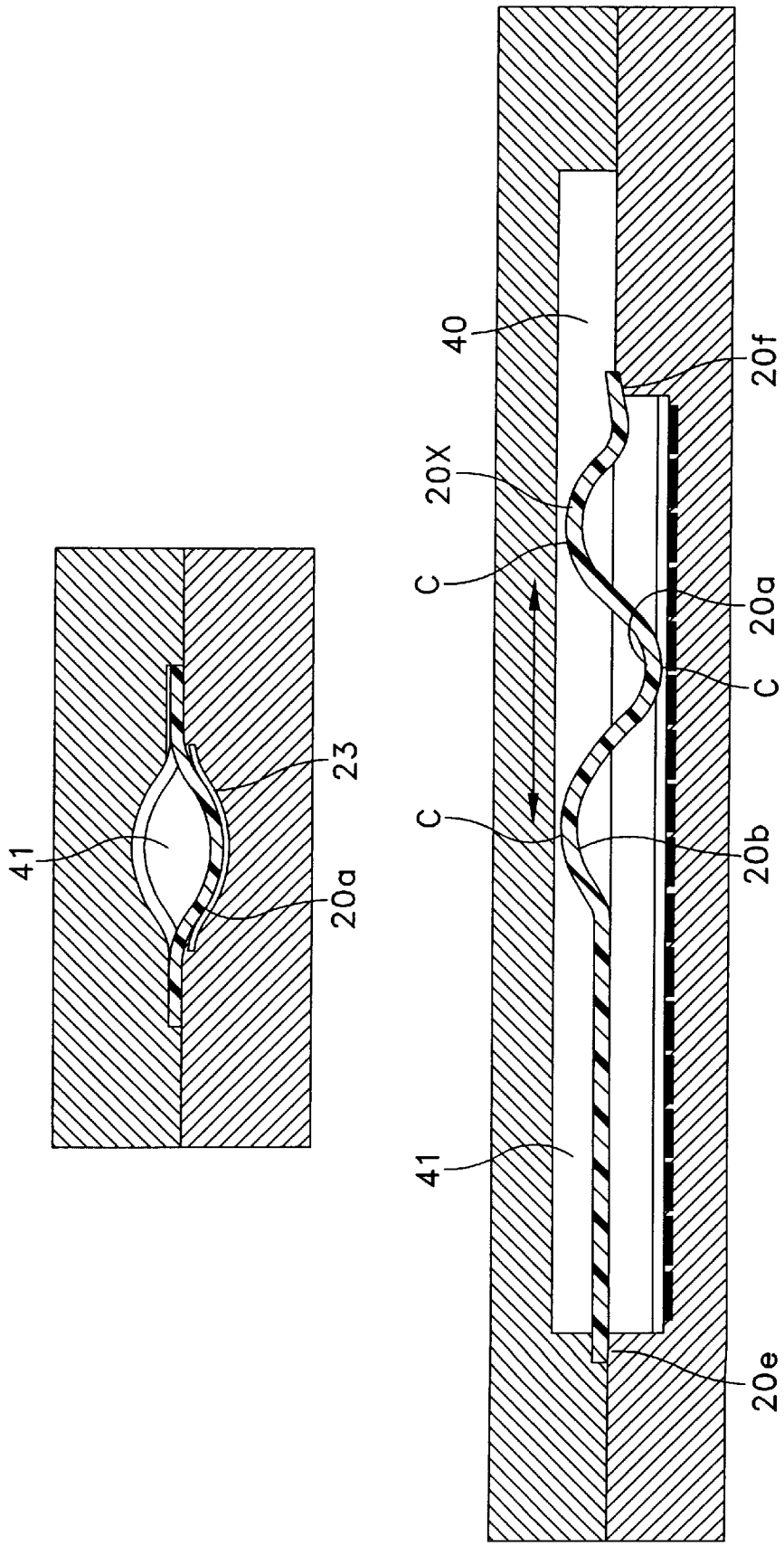
FIG. 11 are micropump applications. An electrostatic attraction force at membrane 20a is transferred via the channel 30 in a repulsing force for membrane section 20b. Thus a "repulsing electrostatic force" is generated, although physically only attracting electrostatic forces can be generated. The space below the membrane section 20a, 20b is a closed cavity 11, 12, 30, not changing its volume and providing steady stationary and dynamic coupling.

FIG. 10 and FIG. 11 are micropumps. FIG. 1 employs check valves 80, 81 for charging and discharging the pump, which operates with cooperating membrane sections 20a, 20b in two parallel channels. Each pair of membranes 20a, 20b is coupled by an individual channel 30 and a multiplicity of rowed up membrane pairs is sequentially controlled to provide a pumping operation. The center C of each buckled membrane is defining—if connected by virtual line—the pumping direction. FIG. 11 shows the curved electrode 23 below the membrane 20a and the pumping room 41 above the membrane 20a.

What is claimed is:

1. Electrostatic membrane actuator for one of a microvalve and a micropump, comprising at least one pair of membrane sections, at least one pair of substrate electrodes locally associated with said membrane sections, said membrane sections enclosing said electrodes to define cavities linked by a linking channel, wherein the membrane sections have at least one layer on each membrane section for providing an intrinsic compressive stress to said sections wherein said sections are operable to buckle out and back between two stable operating points.

2. The electrostatic membrane actuator according to claim 1, wherein the cavities have bottoms and the substrate electrodes are curved and located close to the bottom of said cavities, thereby forming electrostatic driving electrodes for providing driving forces to corresponding counter electrodes provided at the membrane sections.

3. The electrostatic membrane actuator according to claim 1 wherein the linking channel for coupling of the two membrane sections allows the second membrane section of the actuator, which is the one not electrostatically attracted, to move in a direction opposite of the electrostatically attracted first membrane section, by a fluid flow through said channel.

4. The electrostatic membrane actuator according to claim 2, wherein the membrane sections both have metallic layers and are operable in counteraction in a flip-flop manner.

5. The electrostatic membrane actuator according to claim 2, comprising a substrate to which at least a portion outside of the membrane sections is attached, the substrate having two cavities enclosed by said membrane sections and a flat area outside of the membrane sections, said cavities being adapted closely to the shape of the membrane sections.

6. The electrostatic membrane actuator according to claim 5, cavities wherein the linking channel allows fluid to move from one of said cavities—when one membrane section is attracted by electrostatic force—to the other of said cavities and urge the other membrane section off and outwards of the other cavity.

7. The electrostatic membrane actuator according to claim 5, wherein the cavities are connected by a channel in the substrate and covered by a further membrane portion located between the pair of membrane sections.

8. The electrostatic membrane actuator according to claim 1, having separate electrodes for each membrane section, incorporated in the bottom of said cavities and closely adapted to their shape.

9. The electrostatic membrane actuator according to claim 1, in which numerous pairs of membrane sections are lined up to form a pump line and two neighbored cavities for each pair of membranes are respectively coupled though a linking channel at least one of pneumatically and by fluid.

10. The electrostatic membrane actuator according to claim 1, having an electrically conducting contact section in the center of at least one of the membrane sections, adapted to operate with an electrically conducting seat arranged oppositely of the cavities.

11. Method for manufacturing a membrane for an electrostatic membrane actuator, having at least two oppositely buckling membrane sections comprising:

providing a stress-free flat carrier having a first substrate with a layer of insulator on one side, for providing intrinsic stress to the carrier;

bonding the flat carrier with the insulating layer downwards to a second substrate;

removing at least the first substrate of the flat carrier until the intrinsic stress providing layer buckles out at least one of the membrane sections.

12. Method according to claim 11, wherein an electrode is provided in a cavity of the second substrate and the removal of the first substrate of the top-down-bonded wafer is stopped by a further insulating layer, forming an intermediate layer between two semiconductor layers, wherein the stop layer is partly removed, before metallizing the intermediate layer to form a second electrode at least one of in and on the membrane opposite to said electrode in said cavity of the second substrate.

13. The electrostatic membrane actuator according to claim 3, wherein the membrane sections both have metallic layers and are operable in counteraction in a flip-flop manner.

14. The electrostatic membrane actuator according to claim 3, comprising an attaching portion and a substrate to which said portion is attached, the substrate having two cavities enclosed by said membrane sections and a flat area outside of the membrane sections, said cavities being adapted closely to the shape of the membrane sections.

15. A membrane for an electrostatic membrane actuator, having at least two oppositely buckling membrane sections, prepared by a process comprising the steps of:

providing a stress-free flat carrier having a first substrate with a layer of insulator on one side, for providing intrinsic stress to the carrier;

bonding the flat carrier with the insulating layer downwards to a second substrate;

removing at least the first substrate of the flat carrier until the intrinsic stress providing layer buckles out at least one of the membrane sections.

* * * * *

UNITED STATES PATENT AND TRADEMARK OFFICE
CERTIFICATE OF CORRECTION

PATENT NO.    : 6,168,395 B1
DATED         : January 2, 2001
INVENTOR(S)   : Quenzer et al.

It is certified that error appears in the above-identified patent and that said Letters Patent is hereby corrected as shown below:

Drawings,
Please delete drawing figures 1a, 6e-h, 7c, 8 and 9 and replace with substitute figs 1a, 6e-h, 7c, 8 and 9 as shown.

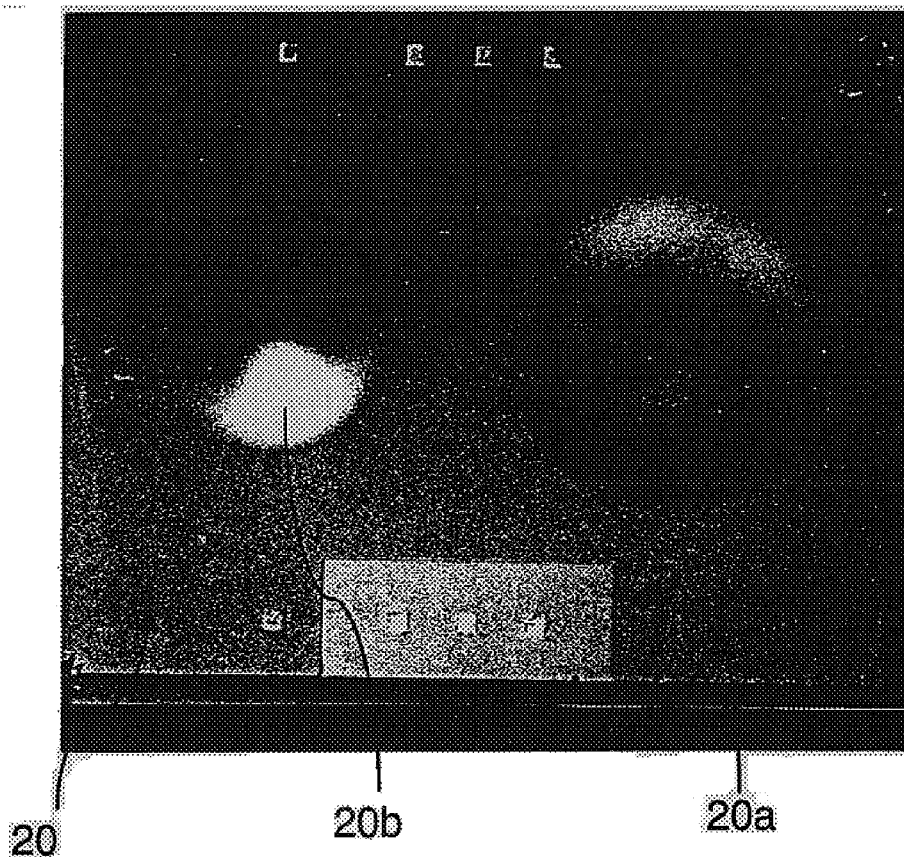

FIG. 1a

UNITED STATES PATENT AND TRADEMARK OFFICE
CERTIFICATE OF CORRECTION

PATENT NO. : 6,168,395 B1
DATED : January 2, 2001
INVENTOR(S) : Quenzer et al.

It is certified that error appears in the above-identified patent and that said Letters Patent is hereby corrected as shown below:

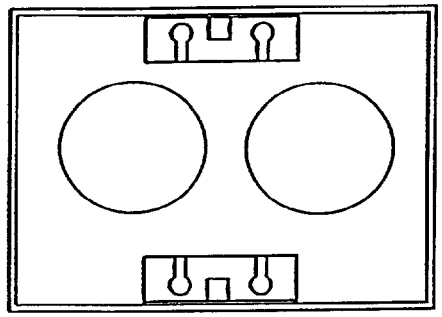

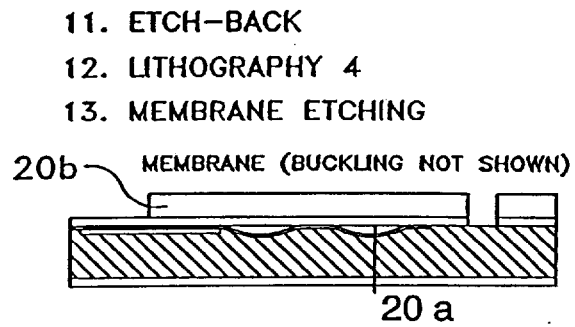

11. ETCH-BACK
12. LITHOGRAPHY 4
13. MEMBRANE ETCHING

20b — MEMBRANE (BUCKLING NOT SHOWN)

20 a

FIG. 6e

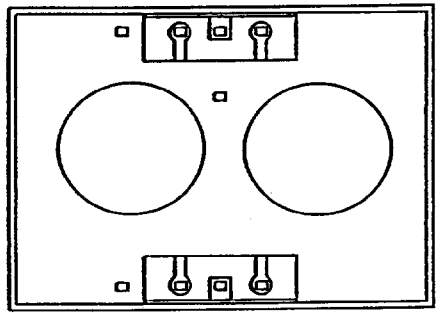

14. LITHOGRAPHY 5: VIAS
15. DRY-ETCHING

FIG. 6f

UNITED STATES PATENT AND TRADEMARK OFFICE
CERTIFICATE OF CORRECTION

PATENT NO. : 6,168,395 B1
DATED : January 2, 2001
INVENTOR(S) : Quenzer et al.

It is certified that error appears in the above-identified patent and that said Letters Patent is hereby corrected as shown below:

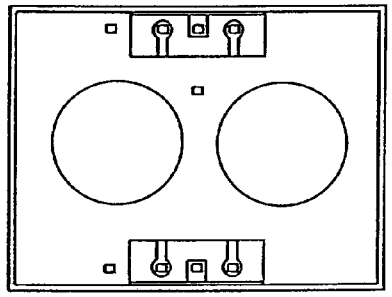

16. SPUTTERING PLATING BASE
17. LITHOGRAPHY 6: METALLISATION
18. ELECTROPLATING
19. IONMILLING PLATING BASE

FIG. 6g

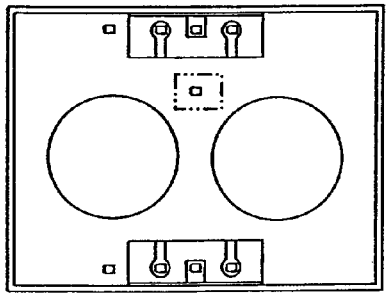

20. LITHOGRAPHY 7 (REAR SIDE)
21. DRY-ETCHING OF REAR SIDE PASSIVATION
22. ANISOTROPIC ETCHING OF SILICON

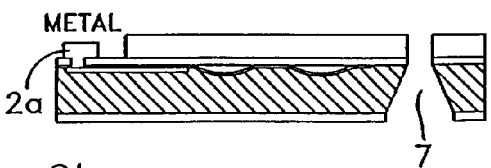

FIG. 6h

UNITED STATES PATENT AND TRADEMARK OFFICE
CERTIFICATE OF CORRECTION

PATENT NO. : 6,168,395 B1
DATED : January 2, 2001
INVENTOR(S) : Quenzer et al.

It is certified that error appears in the above-identified patent and that said Letters Patent is hereby corrected as shown below:

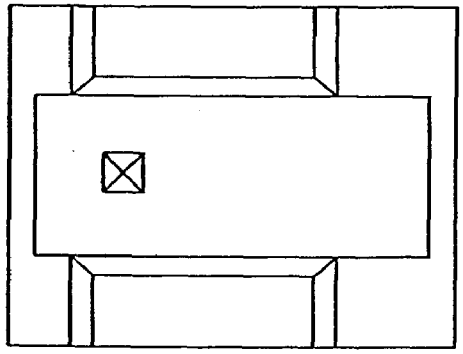

9. LITHOGRAPHY 3: REAR SIDE
10. DRY ETCHING  REAR SIDE
11. ANISOTROPIC ETCHING

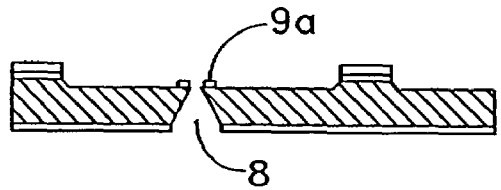

FIG. 7c

UNITED STATES PATENT AND TRADEMARK OFFICE
CERTIFICATE OF CORRECTION

PATENT NO. : 6,168,395 B1
DATED : January 2, 2001
INVENTOR(S) : Quenzer et al.

It is certified that error appears in the above-identified patent and that said Letters Patent is hereby corrected as shown below:

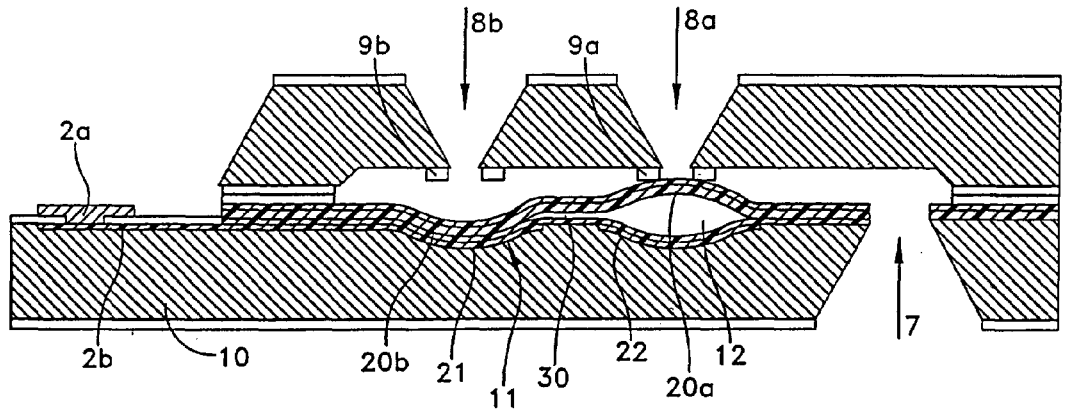

FIG. 8

UNITED STATES PATENT AND TRADEMARK OFFICE
CERTIFICATE OF CORRECTION

PATENT NO.   : 6,168,395 B1
DATED        : January 2, 2001
INVENTOR(S)  : Quenzer et al.

It is certified that error appears in the above-identified patent and that said Letters Patent is hereby corrected as shown below:

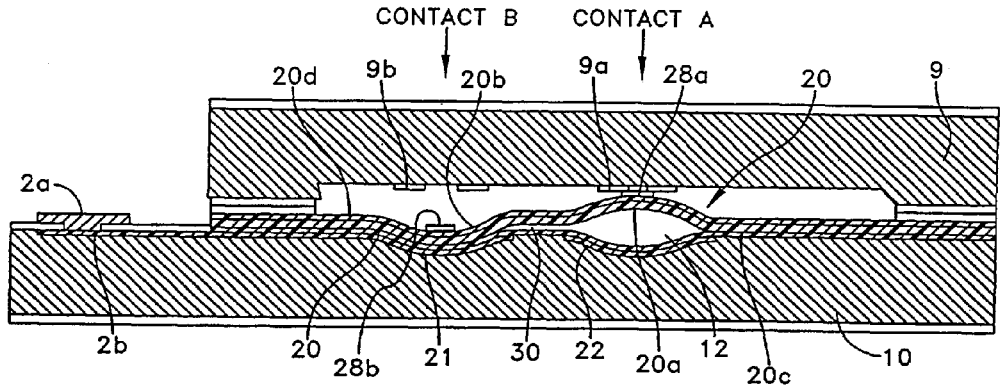

FIG. 9

Signed and Sealed this

Twenty-third Day of July, 2002

*Attest:*

*Attesting Officer*

JAMES E. ROGAN
*Director of the United States Patent and Trademark Office*